(12) United States Patent
Alfano

(10) Patent No.: US 11,567,231 B2
(45) Date of Patent: Jan. 31, 2023

(54) COMPACT BRILLOUIN ANTENNA FOR DETECTING METAL IN FREE SPACE AREA

(71) Applicant: Robert Alfano, New York, NY (US)

(72) Inventor: Robert Alfano, New York, NY (US)

( * ) Notice: Subject to any disclaimer, the term of this patent is extended or adjusted under 35 U.S.C. 154(b) by 0 days.

(21) Appl. No.: 17/835,806

(22) Filed: Jun. 8, 2022

(65) Prior Publication Data
US 2022/0390644 A1     Dec. 8, 2022

Related U.S. Application Data

(60) Provisional application No. 63/208,336, filed on Jun. 8, 2021.

(51) Int. Cl.
| | |
|---|---|
| *G01R 27/02* | (2006.01) |
| *G01R 27/32* | (2006.01) |
| *G01V 3/12* | (2006.01) |
| *H01Q 7/08* | (2006.01) |
| *G01N 22/00* | (2006.01) |
| *G01N 22/04* | (2006.01) |
| *G01N 21/3581* | (2014.01) |
| *G08B 25/00* | (2006.01) |
| *G01R 27/28* | (2006.01) |
| *G01R 27/04* | (2006.01) |
| *G01R 27/06* | (2006.01) |

(52) U.S. Cl.
CPC ........... *G01V 3/12* (2013.01); *G01N 21/3581* (2013.01); *G01N 22/00* (2013.01); *G01N 22/04* (2013.01); *H01Q 7/08* (2013.01); *G01R 27/04* (2013.01); *G01R 27/06* (2013.01); *G01R 27/28* (2013.01); *G08B 25/00* (2013.01)

(58) Field of Classification Search
CPC . G01V 3/12; H01Q 7/08; G08B 25/00; G01N 22/00; G01N 22/04; G01N 21/3581; G01R 27/28; G01R 27/04; G01R 27/06
USPC ... 324/76.11–76.83, 459, 600, 629, 637, 639
See application file for complete search history.

(56) References Cited

U.S. PATENT DOCUMENTS

| | | | |
|---|---|---|---|
| 2003/0189511 A1* | 10/2003 | Lasky | G01V 3/12 342/22 |
| 2013/0113647 A1* | 5/2013 | Sentelle | G01S 13/04 342/22 |
| 2015/0309166 A1* | 10/2015 | Sentelle | G01S 13/04 342/22 |

* cited by examiner

*Primary Examiner* — Raul J Rios Russo
(74) *Attorney, Agent, or Firm* — Nolte Lackenbach Siegel; Myron Greenspan

(57) ABSTRACT

The focus of the teachings is on using Compact ferrite antenna to detect the motion of metal objects using a very low frequency (VLF) square wave, propagated between a pair of compact ferrite-particle dielectric-core RWA antennas in free space. The two salient features in the signal are observed; both of which are characteristic of Brillouin-precursor propagation: (1) a temporal Bessel-like waveform; and (2) an algebraic, rather than exponential, attenuation with distance over three meters. The key element teaching shows pair of source and detector antenna enables the detection of metals (weapon gun, knife) on a person or package between the ferrite-particle dielectric-core antennas-source (S) and detector (D) pairs or arrays of S-D tractor. The detection consisted of a change in the amplitude of the Bessel-like waveform of the received signal for security system to detect weapons.

20 Claims, 9 Drawing Sheets

COMPACT BRILLOUIN ANTENNA FOR DETECTING METAL IN FREE SPACE AREA

BACKGROUND OF THE INVENTION

1. Field of the Invention

The invention generally relates generating E&M Precursors from compact electromagnetic wave antennas and, more specifically, to Random walk magnetic dielectric antenna consisting of nm and urn size particles for VLF, RF MHz and GHz regime for communications, detecting objects and imaging objects.

2. Description of the Prior Art

Free space electromagnetic (EM) wave communications are limited by absorption and scattering, causing a loss of signal strength. This loss of signal strength is a function of distance and, wavelength, and typically drops off exponentially, following Beer's law. It is well understood that antennas are critical enablers of wireless communications-common examples including radios and TV transmitters. The transmission of energy from the local oscillator through the antenna for free space transmission is determined by the length of the antenna. The ideal physical length of a dipole antenna is half the, wavelength of the output EM wave (2/2), which necessarily imposes longer-length antennas for longer EM wavelengths. This condition may also be fulfilled if a random walk is taken along ferrite particles within the antenna's core. This is the basic operating principle of a compact micro-particle random-walk antenna (RWA) [1,2]. The random walk, taken within RWA's core, enables the 2/2 condition for VLF signals to be fulfilled—while the end-to-end physical length of the antenna may be less than 1 meter. In 1914 Brillouin and Sommerfeld describe the generation and propagation on E&M waves in resonance media [3, 4] The underlying theory and review of E&M precursors waves propagation in resonance media is given in the 2006 treatise by Oughstum [5]. The first observation in microwave region was given by Pleshko and Palocz [6]. The two salient characteristic features exhibited by Brillouin-precursor signal propagation are: 1) a temporal Bessel-like waveform; and (2) an algebraic form 1/z 1/2, rather than exponential attenuation with distance z [3, 4, 5, 6].

In 1947, John Wheeler published a seminal paper exploring the power factor for small antennas [7] Following Wheeler's work, thousands of antenna designs were subsequently published. These designs explored different arrangements of metals and dielectrics, all attempting to reduce the size of the antenna without a precipitous loss of power. These designs were still subject to Wheeler's premise: that cylindrical volume and end-to-end length constrain optimal output.

According to Wheeler, the radiative power factor of a small antenna is determined by the This ability of the RWA to reduce the necessary antenna length for EM waves may be understood by considering light scattering in a turbid medium. On such example of the random-relationship:

$$p_s \cong \frac{Ab}{6\pi l^3} \quad (1)$$

where A is the circular area and b is the length of the antenna. The radian length l is given by:

$$l = \frac{\lambda}{2\pi} = \frac{1}{k} \quad (2)$$

where k is the propagation constant of the wave. According to Wheeler, a small antenna is one whose maximum dimension is less than the radian length, so that $$b \ll l = \frac{\lambda}{2\pi} \quad (3)$$

So, Eq. (3) is the criteria for a small antenna. The limitations on conventional antenna designs are the physical parameters A and b, from Eq. (1); and k, from Eq. (2). Although these are the parameters for a small antenna design, the subject of this present paper is an ultra-small design, which is the random-walk antenna (RWA) In the R\:VA, the length b is not proportional to the wavelength. Rather, the length b is proportional to $^{l(1/2)}$. From Alfano [1], [2], the transport scattering length of the EM pulse in the antenna satisfies the expression:

$$b \sim (\lambda l_{tr})^{\frac{1}{2}} \ll \frac{\lambda}{2\pi} \quad (4)$$

where b=L is the length of the antenna. The RWA. contains a propagating element consisting of a core of nanomaterials with a characteristic EM transport length I. The EM wave in the RWA core follows a random diffusion path among the particles such that the average distance traveled is much greater than the length of the antenna. The average path length of a randomly dispersed photon in the R\NA is:

$$\langle z \rangle = \frac{b^2}{2l_{tr}} \quad (5)$$

For example, consider an ideal antenna, with z=λ/2. For FIGS. (4) and (5), substitute 30 kHz corresponding to a free-space wavelength of 10 km. With ltr=100 μm traveled about the ferrite particles in the antenna core, the antenna's effective length is calculated as Leff=1 m.

by intra-cloud lightning. In this case, the end-to-end distance of the lightning flash is much less than the radian length of the output frequency.

Setting b=(ltr)2 in Eq. (1), and substituting the radian length from Eq. (2), the radiation power factor $p_s$ for a random walk antenna is given by $$p_s = \frac{4\pi^2}{3} \frac{A(\lambda l_{tr})}{\lambda^2 l_{tr}} = \frac{4\pi^2}{3} \frac{A}{\lambda^2} \quad (6)$$

This shows that the theoretical RWA power factor is the maximum predicted by Wheeler for a conventional antenna of length λ/2 and is independent of the scattering length of the material. As predicted by these calculations, we have transmitted a low-frequency electromagnetic wave pulse using a small antenna, and the signal was detected by another antenna whose length was less than 1 meter.

This invention is the first known use of compact RWA antennas in VLF regime showing the two salient fingerprints of algebraic 1/z 1/2 and Airy temporal behavior for the detection of metal objects in motion. In these experiments, VLF radiation in the frequency range of 20 kHz to 50 kHz was used. The signal propagated in air between two antennas, source S and detector D and subsequent changes in the signal-due to the metal object's motion between the antennas-were monitored for potential security systems.

SUMMARY OF THE INVENTION

In order to overcome the disadvantages of the prior art and provide real time accurate information regarding the movements of metal objects along a walkway leading to an entrance to a venue, a detection system for the detection of metal objects comprises a pair of spaced Brillouin antenna with one or first antenna serving as a transmitter or Source S of a very low frequency (VLF) signal and the other or second antenna serving as a receiver or detector D of the signal emitted by said first antenna, said first and second antenna being spaced from each other to allow passage of objects therebetween and being formed as compact ferrite-particle dielectric-cores that generate a temporal waveform that exhibits an algebraic attenuation beyond a predetermined distance from said first antenna; and monitoring means for monitoring movement of the metal object moving between said antenna, S, D and for alerting authorities of such detection and movement of said metal object. In one arrangement a plurality of N pairs of spaced Brillouin antenna array is arranged along a predetermined path to form a walkway for individuals to move along, each pair of Brillouin antenna being able to detect the movement of the metal object along said path. The N pairs of spaced antenna form an array of S, D antenna arranged above ground in free space or embedded in the ground along the walkway leading to a venue including a school, church, arena, sporting event and detected before a metal object appears carried along the walkway by a perpetrator. Advantageously, the detection system includes means for alerting police or other authorities once signal is detected and for locking up one or all entrances to said venue.

A method of detecting metal objects in accordance with the invention comprises the steps of arranging a pair of spaced Brillouin antenna with one or first antenna serving as a transmitter or source S of a very low frequency (VLF) signal and the other or second antenna serving as a receiver or detector D of the signal emitted by said first antenna and being formed as compact ferrite-particle dielectric-cores that generate a temporal waveform that exhibits an algebraic attenuation beyond a predetermined distance from said first antenna, and said antenna being spaced from each other to allow passage of objects therebetween; monitoring movement of a metal object moving between said antenna S, D; and alerting authorities of such detection and movement of said metal object. The method also contemplates automatic lockups of one or all entrances to a venue when a suspicious metal object is detected moving along said walkway toward said venue.

BRIEF DESCRIPTION OF THE DRAWINGS

The above and other aspects, features and advantages of the present invention will be more apparent from the following description when taken in conjunction with the accompanying drawings, in which.

DETAILED DESCRIPTION

Figure 1:
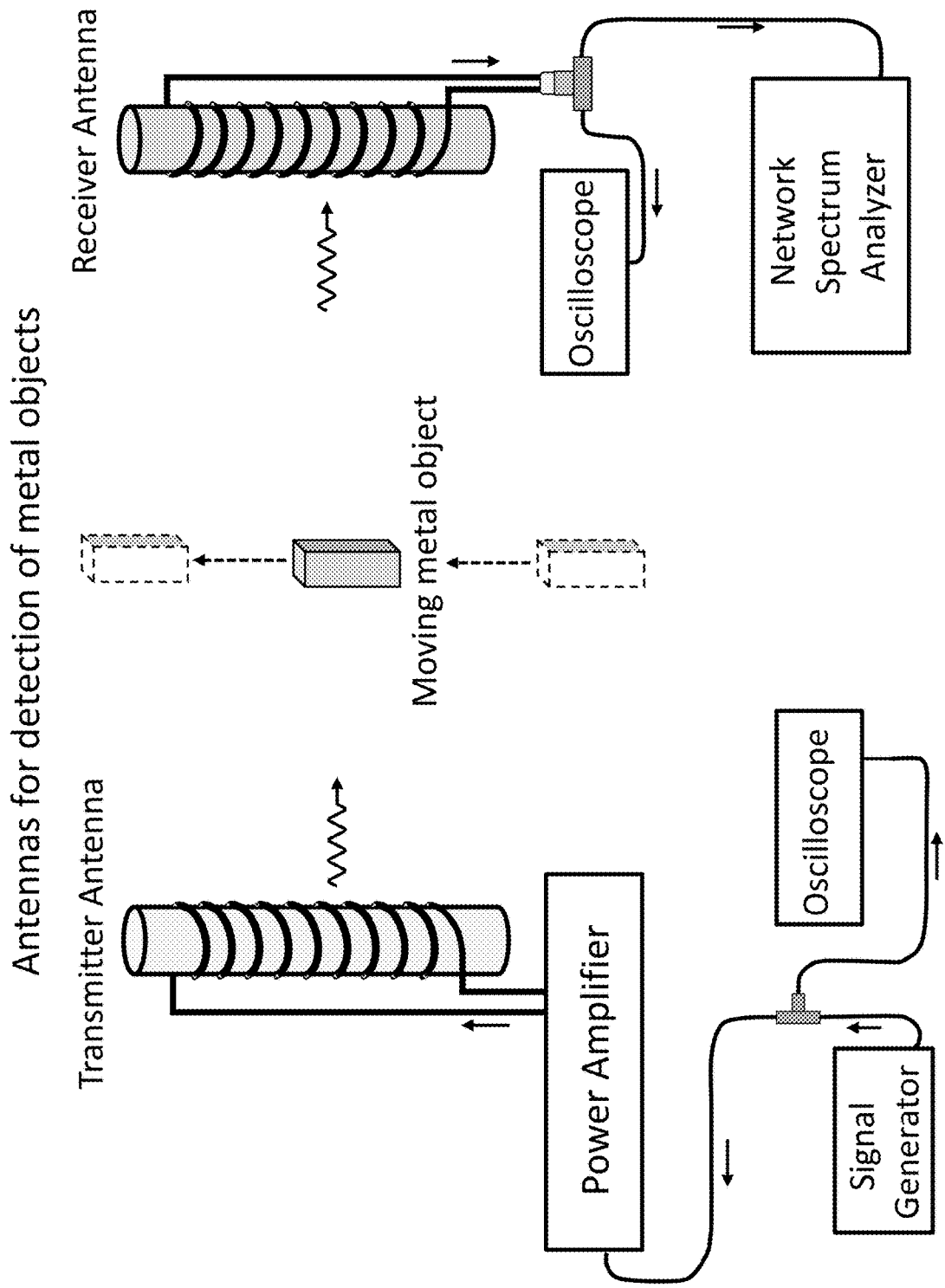
FIG. 1 shows setup used for detecting a metal object in motion between the transmitting (S) and receiving (D) antennas, which disturbed the signal traveling between the two antennas. The metal object was moved around in various positions between the antennas through several orientations.

The setup to demonstrate the system of S, D is illustrated in FIG. 1.

FIG. 1 shows setup used for detecting a metal object in motion between the transmitting (S) and receiving (D) antennas, which disturbed the signal traveling between the two antennas. The metal object was moved around in various positions between the antennas through several orientations.

FIG. 1 shows a schematic of the setup that was used in the lab. Although the setup remains the same for both experimental tests, the key difference is the antennas used on both the transmitter and receiver ends. In both experimental tests, signal intensity as a function of distance was measured.

The orientation of the antennas were parallel and were placed roughly one meter apart, and the distortion of the signal-due to the passing metal object-\vas measured. The frequency used to obtain the following results was approximately 30 kHz.

The RWA modules were tested and shown to provide free-space propagation at approximately 30 kHz, with a signal-loss dependence of $z^{-1/2}$; where z represents distance. The conversion efficiency of the RWA is about $10^{-6}$. The signal intensity followed an algebraic form of non-exponential dependence on distance, i.e., a non-Beer's law dependence is attributed here to a Brillouin precursor waveform traveling in a free space medium. This is illustrated in FIGS. 2 and 3.

Receiving and transmitting antennas were placed at increasing distances apart, up to 3 meters. Propagation measurements were taken in the lab approximately 10 meters above street level. The heavy solid lines in FIGS. 2 and 3 show the observed attenuation of a signal transmitted in free space: an exponential decay with distance. The data (red circles) exhibit the numerical points in which power decay with distance z is proportional to z−1/2. The Brillouin precursor waveform is originated by the particular action of dispersion within the core of the antenna, as oscillations travel from the driving EMF to the core. But, the attenuation with distance from the source is due to differences in how Gaussian and Bessel waveforms propagate through the surrounding environment.

FIG. 1 shows the actual setup that was used in the lab to detect the presence of metals between the transmitter and receiver antennas. Between these two antennas an object of metal composition was placed with multiple orientations and the results were recorded. Results can be observed in FIG. 6 and FIG. 7.

Figure 2:
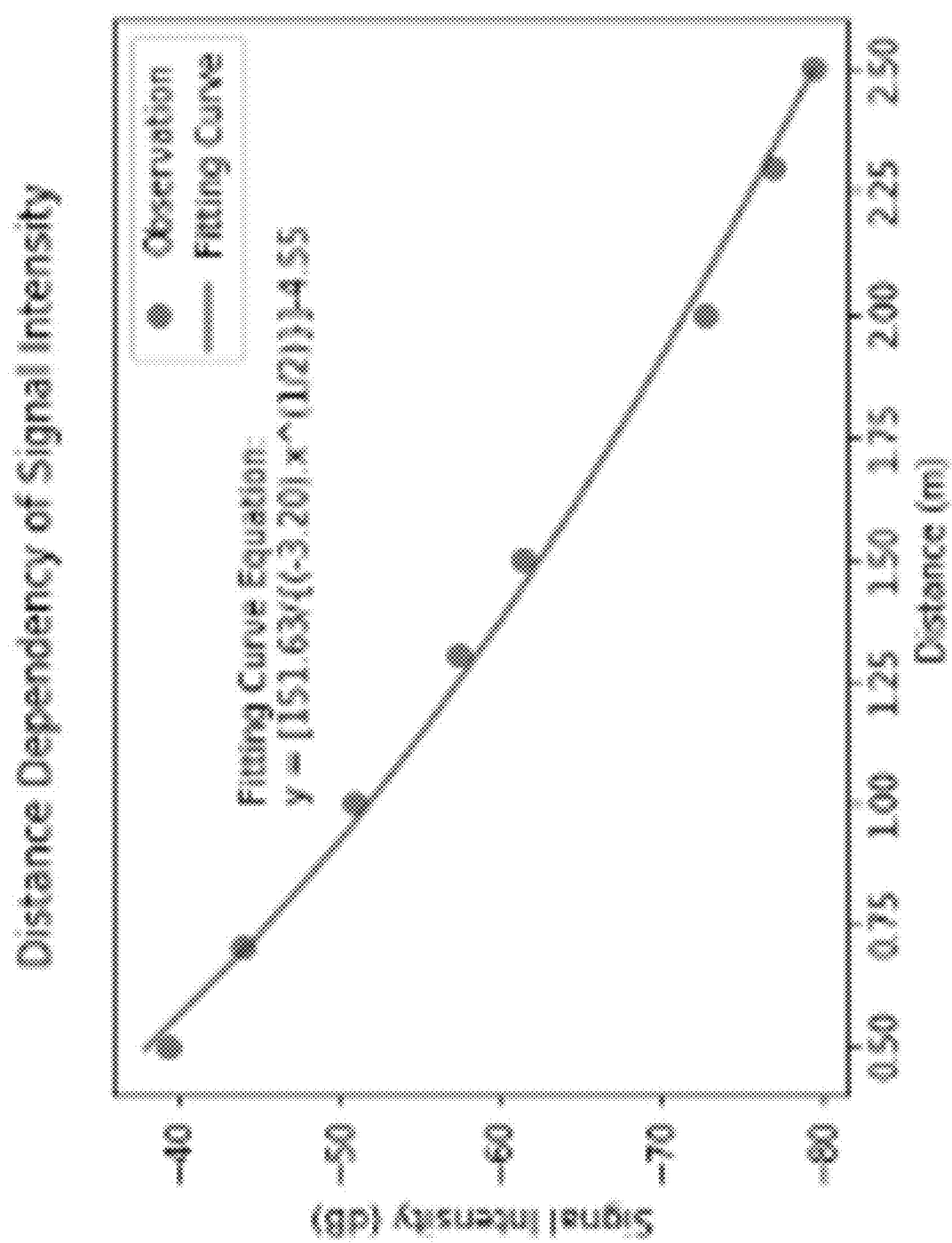
FIG. 2 shows semi-log plot of Power or signal intensity (dBm) vs Distance (m) of the low frequency electromagnetic waves generated by the RWA.
Figure 3:
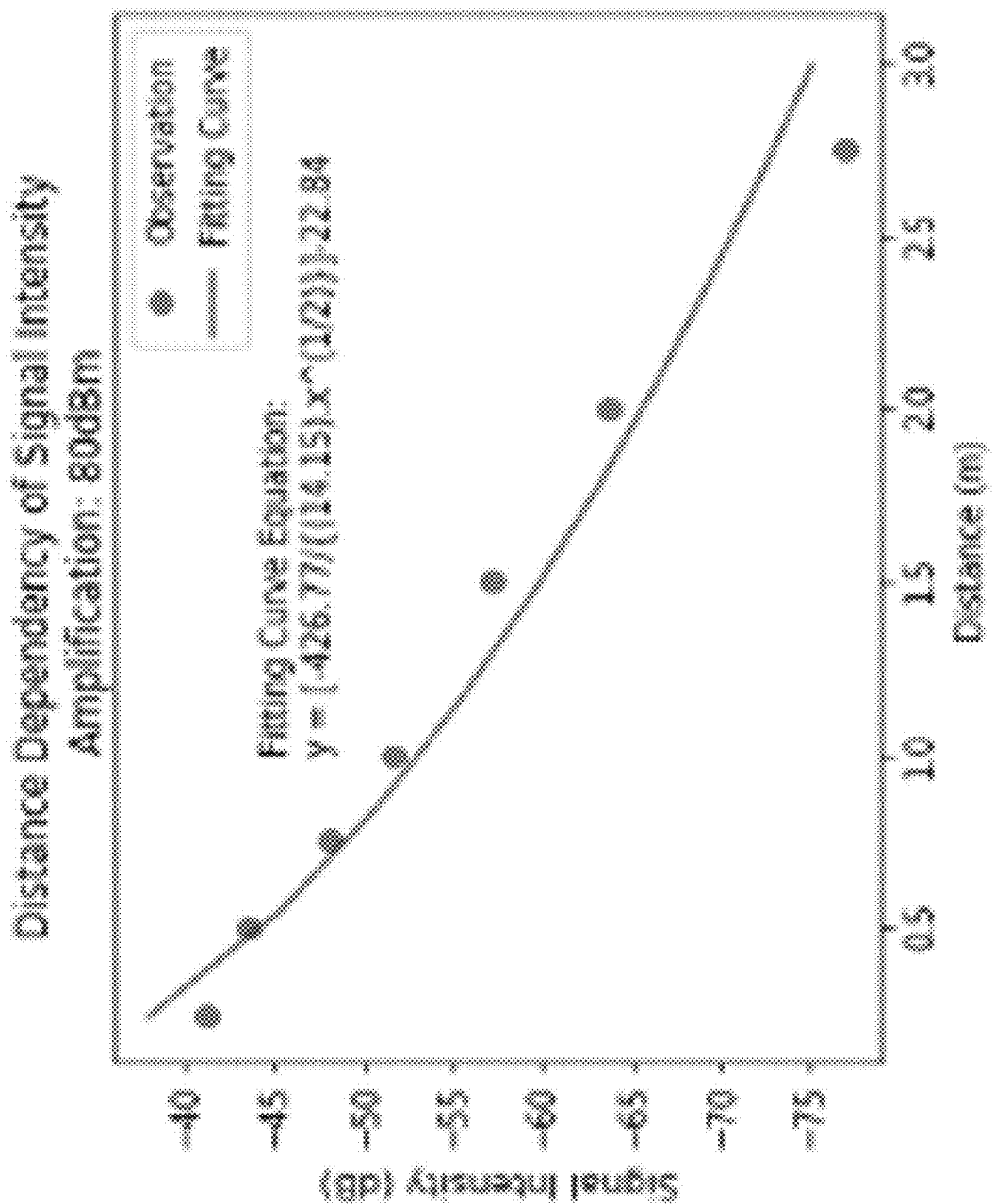
FIG. 3 shows Semi-log plot of Power (dBm) vs Distance (m) of the low frequency electromagnetic waves generated by the RWA.

FIG. 2 shows the signal intensity as a function of distance. A spectrum analyzer was used to measure the signal intensity at various distances spanning from 0.5 m to 2.5 m and the data points were recorded. A best-fit line was added to show that there is indeed an algebraic, rather than exponential, attenuation with distance. This, therefore, confirms the $z^{-1}$ dependence.

Different antennas were employed, in order to verify the z−1/2 dependence. This dependence can be better observed in FIG. 3. Between these two antennas an object of metal composition was placed with multiple orientations and the results were recorded. Results can be observed in FIG. 6 and FIG. 7.

FIG. 3 shows the signal intensity as a function of distance for the setup used in Figure A spectrum analyzer was used to measure the signal intensity at various distances spanning from 0.5 m to 3 m, and the data points were recorded. A line that best fits was added to show that there is indeed an algebraic, rather than exponential, attenuation, with distance. This, therefore, confirms the $z^{-1/2}$ dependence.

Careful selection of the input frequency allows us to isolate a standing wave superimposed on the positive part of the preceding square wave input. This standing wave follows the form of superimposed Brillouin-precursor (Bessel J(1/3)+Bessel J(−−−1/3)) functions. A number of other resonant frequencies generate overlapping Brillouin precursors that fall in the negative part of the input pulse. The arrival time of the multiple Brillouin precursors are sufficiently close that the superposition shows only a slight beating. The Brillouin-precursor arrival times shown in FIG. 4 depend more strongly on the propagation depth, and result in a superimposed signal of high frequency \-Vith rapid beating, but with an envelope that follows the attenuation profile of the Airy function.

Figure 4:
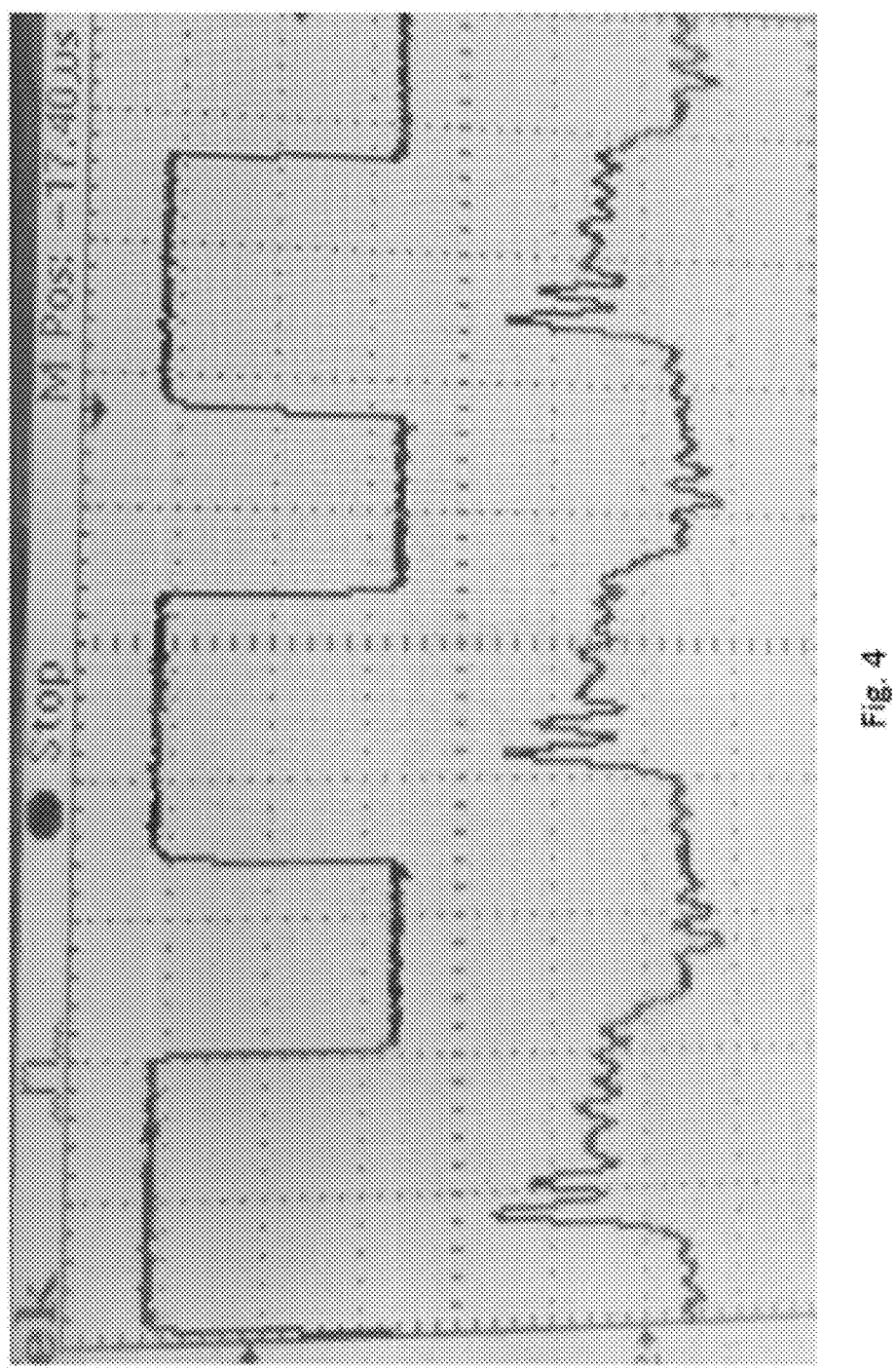
FIG. 4 shows oscilloscope image results taken from the setup shown in FIG. 1. Channel 1 (top channel) shows the transmitted square wave signal Channel 2 (bottom channel) shows the receiver signal obtained. Channel 1 shows the 30 kHz square wave input from the signal generator to the transmission antenna shown at the top of the screen. A broadband, wave that has an approximate square waveform is recorded by the receiving antenna (the bottom wave, channel 2 on the oscilloscope)

FIG. 4 shows Oscilloscope image results taken from the setup shown in FIG. 1. Channel 1 (top channel) shows the transmitted square wave signal. Channel 2 (bottom channel) shows the receiver signal obtained Channel 1 shows the 30 kHz square wave input from the signal generator to the transmission antenna shown at the top of the screen. A broadband wave that has an approximate square waveform is recorded by the receiving antenna (the bottom wave, channel 2 on the oscilloscope).

FIG. 4 is an image of the waveforms captured with the oscilloscope's nm/stop feature.

The top channel shows the input 30-kHz square-wave signal, coming from the signal generator. The bottom channel shows the received signal, which contains a Bessel-like waveform.

Figure 5:
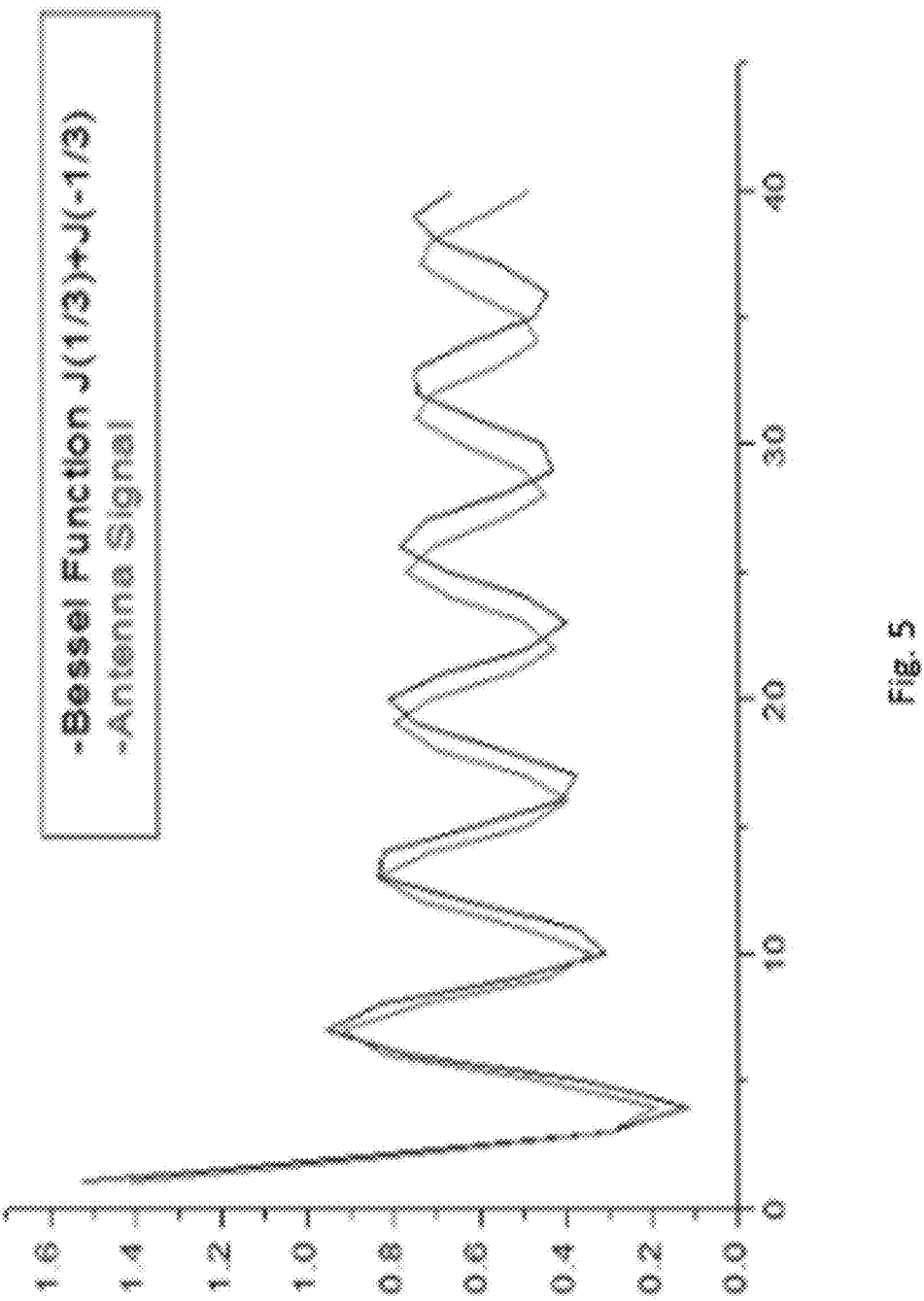
FIG. 5 shows best fit of antenna signal to analytical function. Note the conformance to an Airy function; that is, the function real [Bessel J (1/3)+Bessel J (−1/3)], [8] which describes the Brillouin precursor.

The experimentally measured Brillouin precursor signal is very closely fit by the sum of two Bessel functions with a small offset of the wavefront, as shown in FIG. 5. The Brillouin precursor signal does not have a single solution but follows the attenuation profile of the Airy function. The Airy function is equivalent to Bessel J(1/3)+Bessel J(−1/3). [8] This is shown in FIG. 5.

FIG. 5 shows Best fit of antenna signal to analytical function. Note the conformance to an Airy function; that is, the function real [Bessel J (1/3)+Bessel J (−1/3)], [8] which describes the Brillouin precursor.

FIG. 5 shows the best scaled fit of the antenna signal in comparison to a Bessel function. From FIG. 5, it is clear that the signal conforms to the function real [Bessel J(1/J)+ Bessel J(−−−1/3)], which is the Airy function [8]. This is the "fingerprint" of the Brillouin precursor. It is also important to note that the antenna signal begins to delay behind the Bessel function as time increases.

Figure 6:
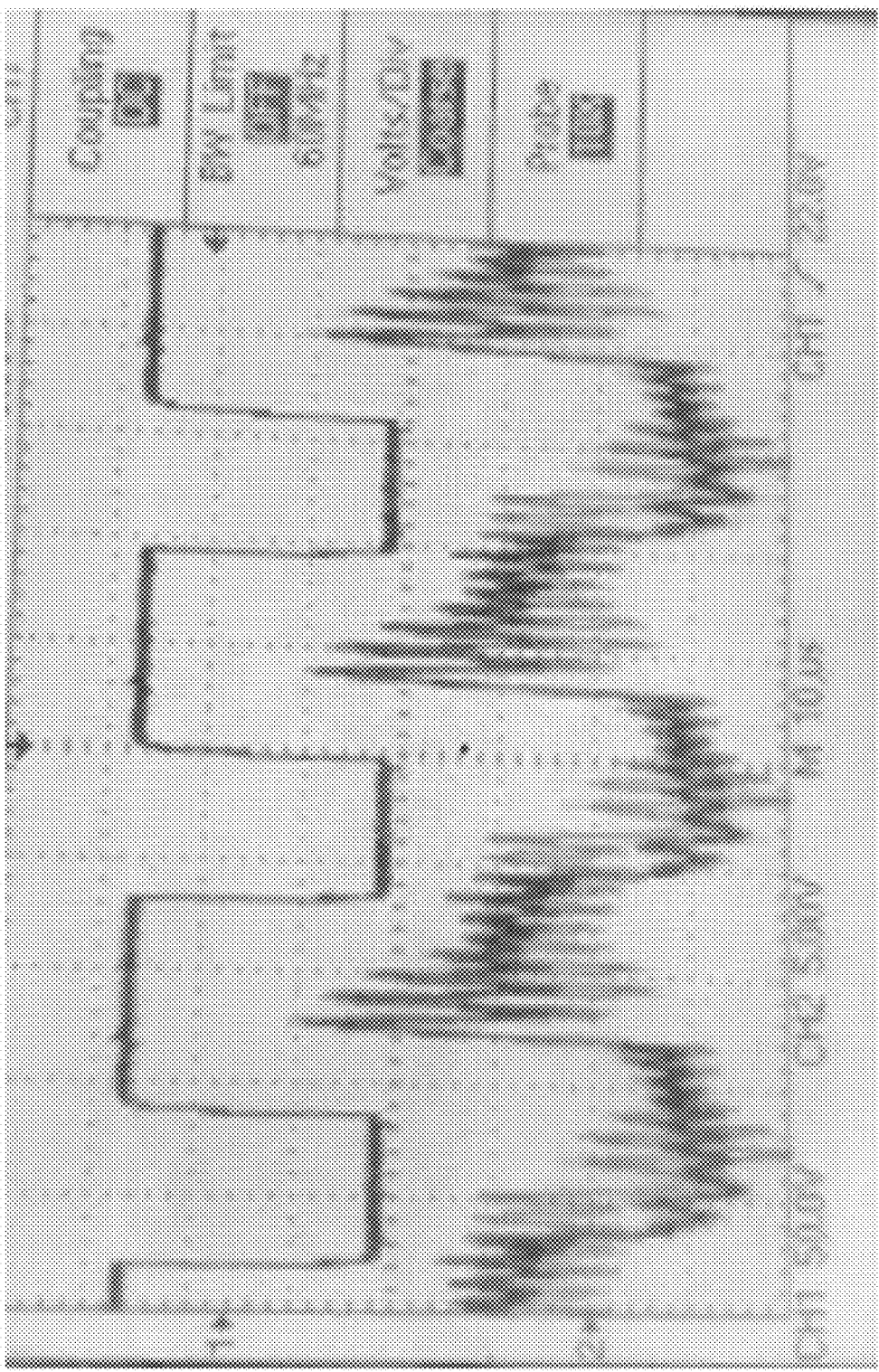
FIG. 6 shows the signal obtained by the receiving antenna when there was no metal object between the transmitting and receiving antennas.
Figure 7:
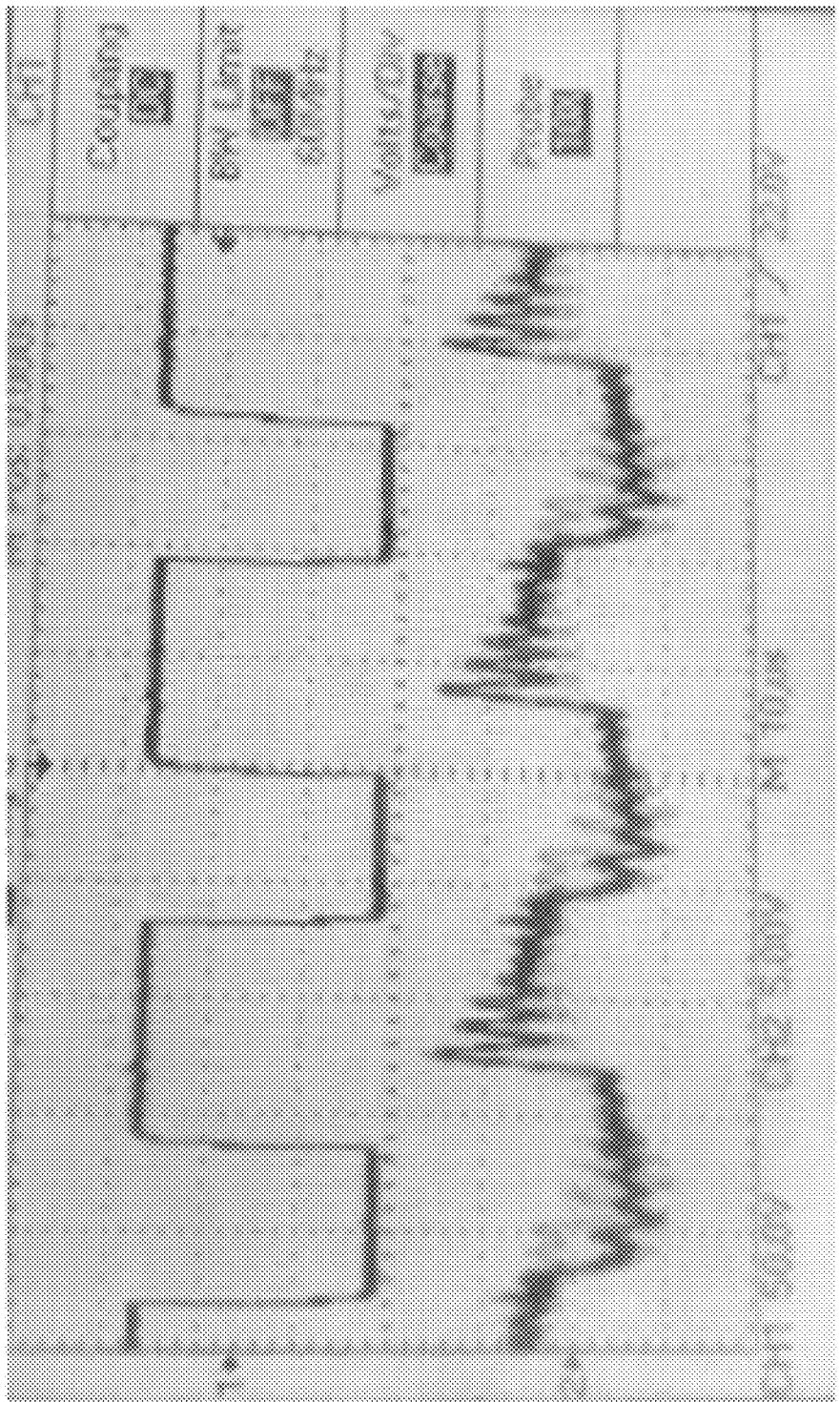
FIG. 7 shows the signal obtained by the receiver antenna when a metal object was placed between the transmitting and receiving antennas.

The impact of metal objects interfering with the signal between the transmitting and receiving antennas can also be observed as shown in FIGS. 6 to 7. As a metal object passes between the two antennas, the peak amplitude of the received signal decreases significantly. In order to test that only objects of metal composition affect the signal, we obtained a reference signal with no object between transmitter and receiver (FIG. 6). Then, a plastic sheet was placed between the transmitting and receiving antennas. No change in signal was detected (data not shown). However, when an iron-containing metal rod was placed between the two antennas, significant attenuation was observed (FIG. 7). The difference in attenuation observed when the metal rod was placed between the transmitting and receiving antennas was approximately a change of 7-8 volts in the peak voltage.

FIG. 6 shows the signal obtained by the receiving antenna when there was no metal object between the transmitting and receiving antennas.

FIG. 6 is a run/stop snapshot of the oscilloscope when there is no presence of metal between the transmitter and receiver antennas. Channel 1 (top) shows the 30-kHz square wave input signal from the signal generator. Channel 2 (bottom) shows the received signal from the receiving antenna. The amplitude change of the channel 2 waveform is then observed when an item of metal composition is placed between the two antennas. This amplitude change can be 8 observed in FIG. 7.

FIG. 7 shows the signal obtained by the receiver antenna when a metal object was placed between the transmitting and receiving antennas.

FIG. 7 is a nm/stop snapshot of the oscilloscope when a metal object was placed between the transmitter and receiver antennas. Channel 1 (top) shows the 30-kHz square wave input signal from the signal generator. Channel 2 (bottom) shows the received signal from the receiving antenna. The amplitude change can be observed and shows that there is indeed a significant drop in voltage amplitude when an item of metal composition is placed between the transmitter and receiver antennas.

Figure 8A:
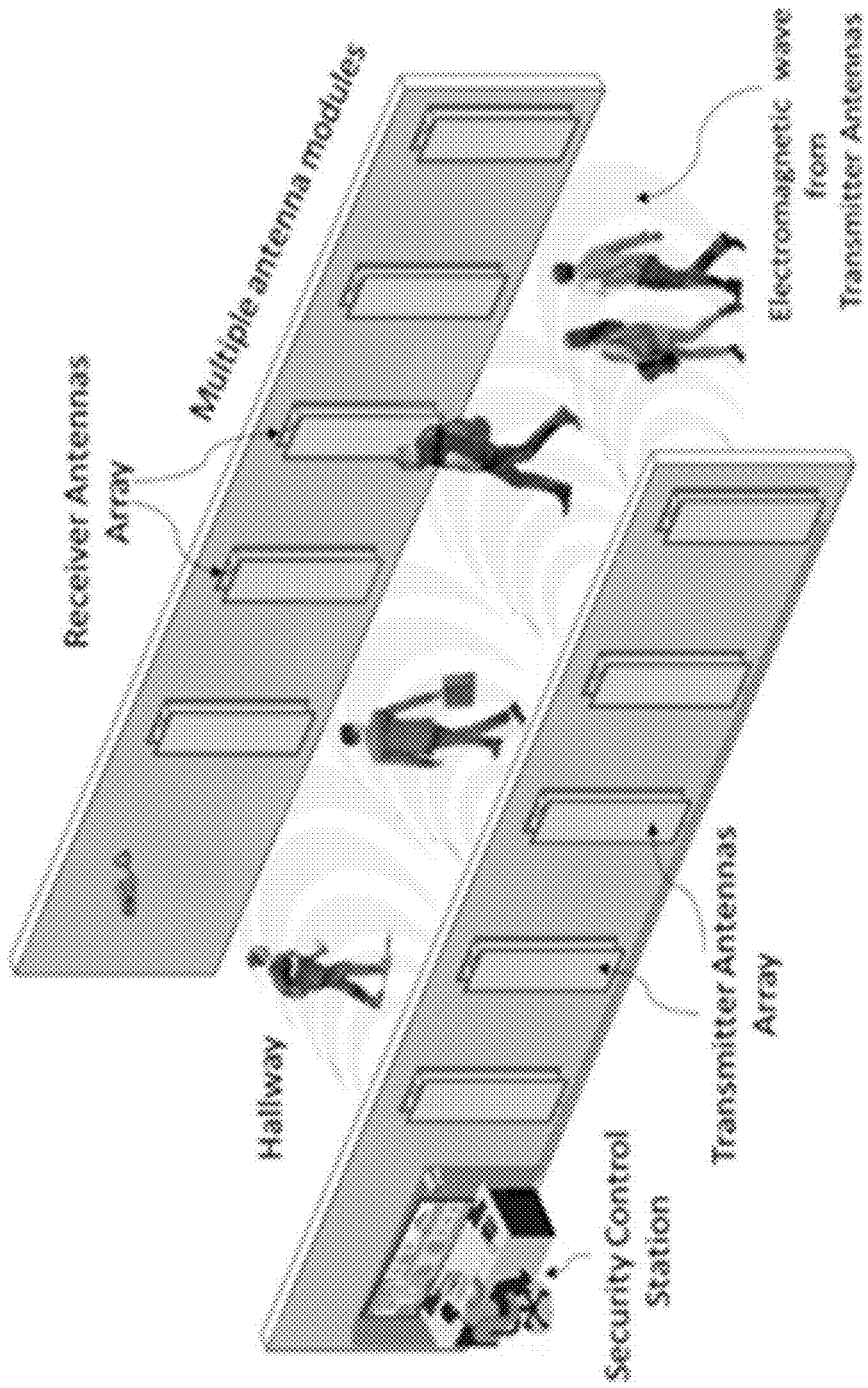
FIG. 8a shows a possible implementation for this RWA-based metal-detection technology in a hallway or corridor.

Through analysis of the signal in channel 2 of the oscilloscope, which has a damped sine-wave profile, the varying amplitude of the signal due to the impact of metals can be observed. The preceding results, which were observed in FIGS. 6 and 7, can be used to develop more discreet and efficient forms of metal-detection security systems. Possible setup for the development of the technology is shown in FIG. 8.

FIG. 8 illustrates two possible implementations, a and b, of this technology for monitoring outside the entrance way to sporting event, schools, house of worship etc. Using an array of transmitting antennas propagating an electromagnetic wave on one side of a hallway towards an array of receiver antennas on the other side of the hallway, the change in amplitude of the received signal can be detected. This damping of amplitude of the received signal-which is caused by the presence of metal between the transmitting and receiving antennas-can then be traced by a person at the security control center, to which all the antennas are connected. By analyzing the signal attenuation caused when an individual walks between the antennas, it can be determined whether that individual is carrying an object of metal composition, which may be of concern. The advantage of this design is that it is discreet the antennas can be placed behind thin walls, and pedestrians will not know of their presence. A benefit of this approach is that it provides metal-detection capability for security, while causing less disruption of pedestrian traffic.

FIG. 8 shows a possible implementation for this RWA-based metal-detection technology a) in a hallway or corridor and b) in a school entrance.

Figure 8B:
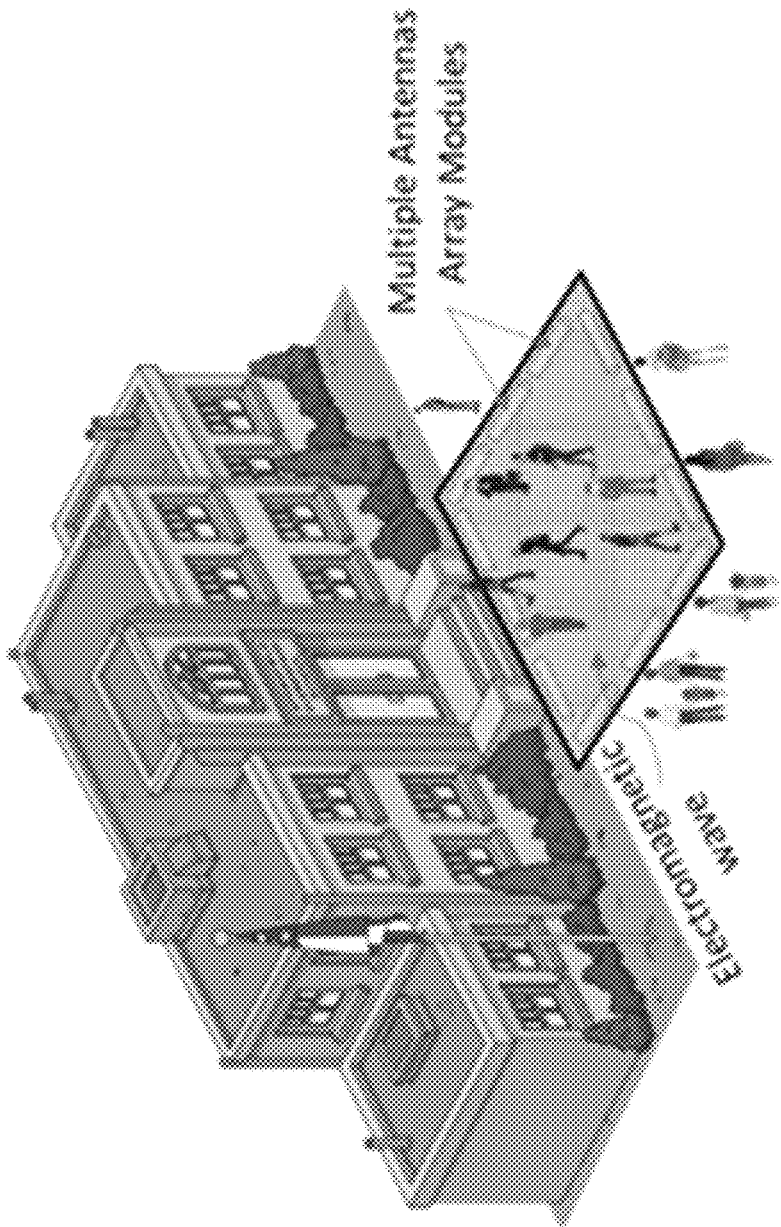
FIG. 8b shows a possible implementation for this RWA-based metal-detection technology in a school entrance.

With public safety being the main concern, we must acknowledge where groups of people gather on a daily basis. This leads to the possible implementation for this security system which can be used at places such as schools. The implementation of FIG. 8b is a conceptually more complex for discretion purposes because the transmitter and receiver antennas will be placed in front of a school entrance with nothing to hide their presence. This issue can be fixed by placing the transmitter and receiver antennas into a vertically placed PVC pipe every 8-10 feet, essentially making an array of antennas. This will give individuals the illusion that these vertically placed PVC pipes were placed there as road blocks, keeping the antennas disguised. It is important that the object covering the antennas is not one of metal composition because the receiver signal will be altered at all times. Using the same principle of analysis as in FIG. 8a, the signal attenuation caused when an individual walks between the antennas can be used to determine whether that individual is carrying an object of metal composition which may be of concern.

We have demonstrated a practical metal-detection application using a pair of ferrite-particle dielectric-core antennas in free space. We have also shown that objects of non-metal composition would not impact the profile and amplitude of the Bessel-like waveform. Our experimental data showed that (1) the Bessel-like waveform profile was not impacted by objects of non-metal composition, while (2) the Bessel-like waveform profile was significantly impacted by objects having metal composition. Furthermore, the attenuation profile was experimentally observed to vary algebraically with distance, rather than the exponential variation predicted by Beer's law. This trend was observed across a distance greater than 3 meters. This algebraic ($z \cdot ^{-1/2}$) attenuation dependence is one of the salient characteristics of Brillouin-precursor propagation. As a practical application, we have also described how the signatures of Brillouin-precursor propagation can serve as the foundation for a novel metal-detection security system. The proposed system is discreet, non-invasive, and uses minimal hardware. The system may be used to provide a first-order security screening, alerting users to any matters of safety concern.

While the invention has been shown and described with reference to certain embodiments thereof, it will be understood by those skilled in the art that various changes in form and detail may be made therein without departing from the spirit and scope of the invention as defined by the appended claims and their equivalents.

The invention claimed is:

1. A detection system for the detection of metal objects comprising a pair of spaced Brillouin antenna with one or first antenna serving as a transmitter or Source S of a very low frequency (VLF) signal and the other or second antenna serving as a receiver or detector D of the signal emitted by said first antenna, said first and second antenna being spaced from each other to allow passage of objects therebetween and being formed as compact ferrite-particle dielectric-cores that generate a temporal waveform that exhibits an algebraic attenuation beyond a predetermined distance from said first antenna S; and monitoring means for monitoring movement of a metal object moving between said antenna S, D and for alerting authorities of such detection and movement of said metal object.

2. The detection system of claim 1, wherein said predetermined distance is approximately from ½ meter to three meters.

3. The detection system of claim 1, wherein said first antenna S is wherein first antenna S is connected to a generator of a VLF pulse signal.

4. The detection system of claim 3, wherein said VLF pulse signal has a frequency within the range of 1 KHz to 100 KHz.

5. The detection system of claim 1, wherein said second antenna D is connected to a computer.

6. The detection system of claim 1, wherein said second antenna D is connected to a spectrum analyzer.

7. The detection system of claim 1, further comprising a plurality of N pairs of spaced Brillouin antenna array arranged along a predetermined path that forms a walkway for individuals to move along, each pair of Brillouin antenna of said array being able to detect the movement of a metal object along said path.

8. The detection system of claim 7, wherein said N pairs of spaced antenna form an array of S, D antenna arranged above ground in free space or embedded in the ground along a walkway leading to a venue including a school, church, arena, sporting event and detected before a metal object appears carried along the walkway by a perpetrator.

9. The detection system of claim 8, further comprising means for alerting police or other authorities once signal is detected and for locking up entrance to said venue.

10. The detection system of claim 1, wherein said detector D can detect metal objects that include a gun, knife, bomb, nuclear material, dirty bomb and metal Dewar concealed or hidden on a person or package.

11. The detection system of claim 1, wherein a plurality of pairs of spaced Brillouin antenna S-D are arranged in an array of transmitter antennas and an associated array of receiver antenna on opposing sides of a walkway leading to a venue such as a school, stadium, theatre, office building, courthouse and government building.

12. The detection system of claim 1, further comprising camouflaging means for concealing and camouflaging said first and second antenna S, D to individuals that pass in the space between said antenna.

13. A method of detecting metal objects comprising the steps of arranging a pair of spaced Brillouin antenna with one or first antenna serving as a transmitter of a very low frequency (VLF) signal and the other or second antenna serving as a receiver of the signal emitted by said first antenna and being formed as compact ferrite-particle dielectric-cores that generate a temporal waveform that exhibits an algebraic attenuation beyond a predetermined distance from said first antenna, and said antenna being spaced from each other to allow passage of objects therebetween; monitoring movement of a metal object moving between said antenna S, D; and alerting authorities of such detection and movement of said metal object.

14. The method of claim 13, wherein said first antenna is connected to a source for generating a VLF pulse signal.

15. The method of claim 14, wherein said VLF pulse signal has a frequency within the range of 1 KHz to 100 KHz.

16. The method of claim 13, further comprising the step of arranging an array of spaced Brillouin antenna along a predetermined path to form a walkway for individuals to move along, each pair of Brillouin antenna being able to detect the movement of a metal object along said path.

17. The method of claim 13, further comprising the step of locking venue entrances upon detection of movement of a metal object by a perpetrator along said walkway.

18. The method of claim 13, further comprising the step of embedding said antenna within the ground.

19. The method of claim 13, further comprising the step of arranging said antenna above the ground.

20. The method of claim 19, further comprising the step of camouflaging said antenna above the ground.

* * * * *